United States Patent
Liou et al.

(10) Patent No.: US 10,170,623 B2
(45) Date of Patent: Jan. 1, 2019

(54) METHOD OF FABRICATING SEMICONDUCTOR DEVICE

(71) Applicant: UNITED MICROELECTRONICS CORP., Hsin-Chu (TW)

(72) Inventors: En-Chiuan Liou, Tainan (TW);
Tang-Chun Weng, Chiayi (TW);
Chien-Hao Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/796,874

(22) Filed: Oct. 30, 2017

(65) Prior Publication Data

US 2018/0047848 A1 Feb. 15, 2018

Related U.S. Application Data

(62) Division of application No. 14/841,628, filed on Aug. 31, 2015, now Pat. No. 9,837,540.

(30) Foreign Application Priority Data

Jul. 20, 2015 (CN) .......................... 2015 1 0424934

(51) Int. Cl.
*H01L 21/762* (2006.01)
*H01L 29/78* (2006.01)
(Continued)

(52) U.S. Cl.
CPC ...... *H01L 29/7851* (2013.01); *H01L 29/0653* (2013.01); *H01L 29/66545* (2013.01); *H01L 29/66795* (2013.01); *H01L 29/785* (2013.01)

(58) Field of Classification Search
CPC ............ H01L 29/7851; H01L 29/0653; H01L 29/66795; H01L 29/66545; H01L 21/823431; H01L 21/823821; H01L 21/845; H01L 27/10826; H01L 21/76; H01L 21/762; H01L 21/76229; H01L 21/76232
See application file for complete search history.

(56) References Cited

U.S. PATENT DOCUMENTS 7,326,608 B2   2/2008  Lee
7,399,664 B1 *  7/2008  Anderson ............. H01L 29/785
                                                         257/E21.4
(Continued)

OTHER PUBLICATIONS

Huang, Title of Invention: Patterned Structure of a Semiconductor Device and a Manufacturing Method Thereof, U.S. Appl. No. 14/710,602, filed May 13, 2015.
(Continued)

*Primary Examiner* — Bitew A Dinke
(74) *Attorney, Agent, or Firm* — Winston Hsu

(57) ABSTRACT

A semiconductor device and a method of fabricating the same, the semiconductor device includes a plurality of fin shaped structures, a trench, a spacing layer and a dummy gate structure. The fin shaped structures are disposed on a substrate. The trench is disposed between the fin shaped structures. The spacing layer is disposed on sidewalls of the trench, wherein the spacing layer has a top surface lower than a top surface of the fin shaped structures. The dummy gate structure is disposed on the fin shaped structures and across the trench.

14 Claims, 12 Drawing Sheets

(51) Int. Cl.
*H01L 29/66* (2006.01)
*H01L 29/06* (2006.01)

(56) References Cited

U.S. PATENT DOCUMENTS

| | | | |
|---|---|---|---|
| 7,994,020 B2 | 8/2011 | Lin et al. | |
| 8,470,714 B1 | 6/2013 | Tsai | |
| 8,951,918 B2 | 2/2015 | Li et al. | |
| 9,608,062 B1* | 3/2017 | Tseng | H01L 29/0653 |
| 2006/0046407 A1* | 3/2006 | Juengling | H01L 27/10823 |
| | | | 438/301 |
| 2008/0050885 A1* | 2/2008 | Tang | H01L 21/3086 |
| | | | 438/424 |
| 2008/0265363 A1* | 10/2008 | Gambino | H01L 21/76229 |
| | | | 257/510 |
| 2009/0101968 A1 | 4/2009 | Sugioka | |
| 2010/0289117 A1* | 11/2010 | Chen | H01L 21/76232 |
| | | | 257/510 |
| 2013/0267075 A1* | 10/2013 | Lee | H01L 21/76232 |
| | | | 438/424 |
| 2014/0159167 A1* | 6/2014 | Basker | H01L 29/785 |
| | | | 257/410 |
| 2014/0185355 A1* | 7/2014 | Juengling | G11C 11/401 |
| | | | 365/72 |
| 2014/0225219 A1 | 8/2014 | Huang | |
| 2014/0319625 A1* | 10/2014 | Zhao | H01L 29/6656 |
| | | | 257/402 |
| 2014/0353763 A1 | 12/2014 | Chung | |
| 2015/0021695 A1* | 1/2015 | Hu | H01L 29/785 |
| | | | 257/368 |
| 2015/0037956 A1 | 2/2015 | Yoo | |
| 2015/0047891 A1 | 2/2015 | Lee et al. | |
| 2015/0050792 A1 | 2/2015 | Samavedam et al. | |
| 2015/0115373 A1* | 4/2015 | Yu | H01L 21/823418 |
| | | | 257/401 |
| 2015/0214341 A1 | 7/2015 | Shin | |
| 2015/0325575 A1* | 11/2015 | Park | H01L 29/0653 |
| | | | 257/401 |
| 2015/0380316 A1* | 12/2015 | Yu | H01L 21/823481 |
| | | | 257/506 |
| 2016/0049401 A1 | 2/2016 | Sung | |
| 2016/0093715 A1* | 3/2016 | Liu | H01L 29/66545 |
| | | | 257/401 |
| 2016/0155739 A1* | 6/2016 | Ting | H01L 29/0653 |
| | | | 257/401 |
| 2016/0276342 A1 | 9/2016 | Lim | |
| 2016/0276429 A1 | 9/2016 | Tseng | |
| 2016/0284587 A1* | 9/2016 | Liou | H01L 21/76229 |
| 2016/0284706 A1 | 9/2016 | Chung | |
| 2016/0300949 A1* | 10/2016 | Lee | H01L 29/7848 |
| 2016/0315080 A1 | 10/2016 | Song | |
| 2016/0343607 A1* | 11/2016 | Wan | H01L 21/28008 |
| 2016/0351565 A1* | 12/2016 | Sung | H01L 27/0886 |
| 2016/0380052 A1 | 12/2016 | Kim | |

OTHER PUBLICATIONS

Tseng, Title of Invention: FinFET Having a Trench in the Fin Shaped Structure, U.S. Appl. No. 14/684,445, filed Apr. 13, 2015.

* cited by examiner

METHOD OF FABRICATING SEMICONDUCTOR DEVICE

CROSS REFERENCE TO RELATED APPLICATIONS

This application is a Divisional of application Ser. No. 14/841,628 filed Aug. 31, 2015, and included herein by reference.

BACKGROUND OF THE INVENTION

1. Field of the Invention

The invention relates to a semiconductor device and a method of fabricating the same, and more particularly, to a semiconductor device having a dummy gate structure and a method of fabricating the same.

2. Description of the Prior Art

With the trend in the industry being scaling down the size of the field effect transistors (FETs), three-dimensional or non-planar transistor technology, such as fin field effect transistor technology (FinFET) has been developed to replace planar FETs. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased.

However, layout designs of the FinFET structures still face some issues in conventional FinFET fabrication. Hence, how to improve the current FinFET fabrication and structure for resolving such issue has become an important task in this field.

SUMMARY OF THE INVENTION

It is one of the primary objectives of the present invention to provide a semiconductor device and a method of forming the same, wherein the semiconductor device includes a dummy gate structure covering on edges of fin shaped structures such that it is sufficient to obtain a more reliable semiconductor device.

To achieve the purpose described above, the present invention provides a semiconductor device including a plurality of fin shaped structures, a trench, a spacing layer and a dummy gate structure. The fin shaped structures is disposed on a substrate. The trench disposed between the fin shaped structures. The spacing layer is disposed on sidewalls of the trench, wherein the spacing layer has a top surface being lower than a top surface of the fin shaped structure. The dummy gate structure is disposed on the fin shaped structures and across the trench.

To achieve the purpose described above, the present invention provides a method of forming a semiconductor device including following steps. First of all, a plurality of mandrels on a substrate is provided. Next, a portion of the mandrels and a portion of the substrate are removed, to form a trench across the mandrels. Then, a plurality of spacers are formed on sidewalls of the mandrels and the trench, and the spacers are used as a mask to form a plurality of fin shaped structures on the substrate and a plurality of shallow trenches surrounding the fin shaped structures. Finally, a portion of the spacers is removed to form a spacing layer on the sidewalls of the trench, wherein the spacing layer has a top surface being lower than a top surface of the fin shaped structures.

The present invention mainly forms a trench which penetrated through the mandrels and extends deeply into the substrate, and then processes the formation of spacers, so that, a portion of the spacer may cover the sidewalls of the trench, to form the spacing layer. Through such arrangement of forming the spacing layer, it is sufficient to avoid silicon atoms contained in the sidewalls of the trench being over-consumed by or over-reacted with oxygen provided in the subsequent forming process of the shallow trench isolation or the dielectric layer, like a flowable chemical vapor deposition process or a thermal oxidation process for example, and also to prevent the critical dimension of the trench opening from getting enlarge. According to these, the present invention enables to form a single dummy gate structure which is across the trench and simultaneously covers on two edges of the fin shaped structure adjacent to the trench, so as to achieve better element performance and integration.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
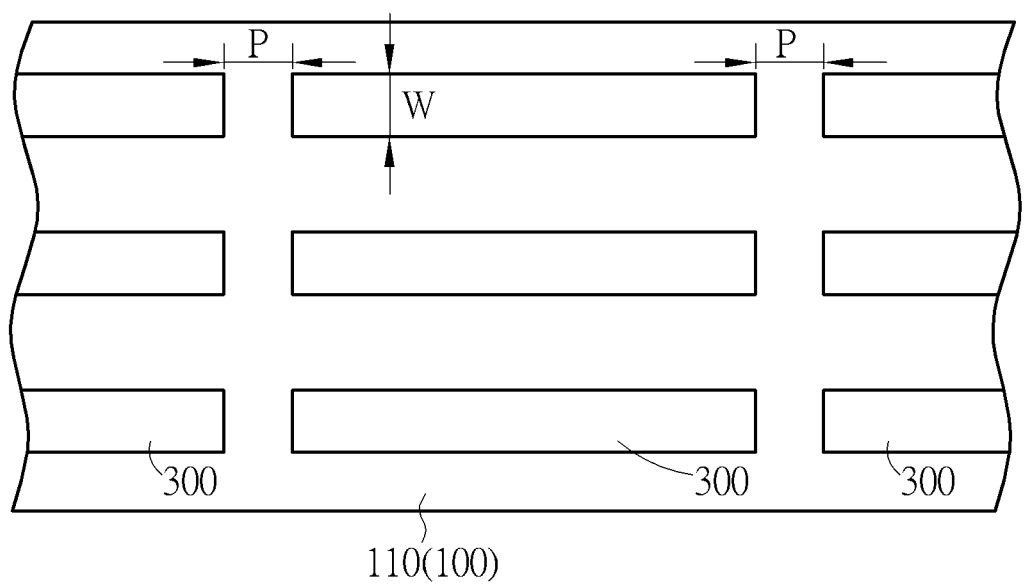
FIG. 1 to FIG. 9 are schematic diagrams illustrating a method of forming a semiconductor device according to a first embodiment of the present invention.
Figure 2:
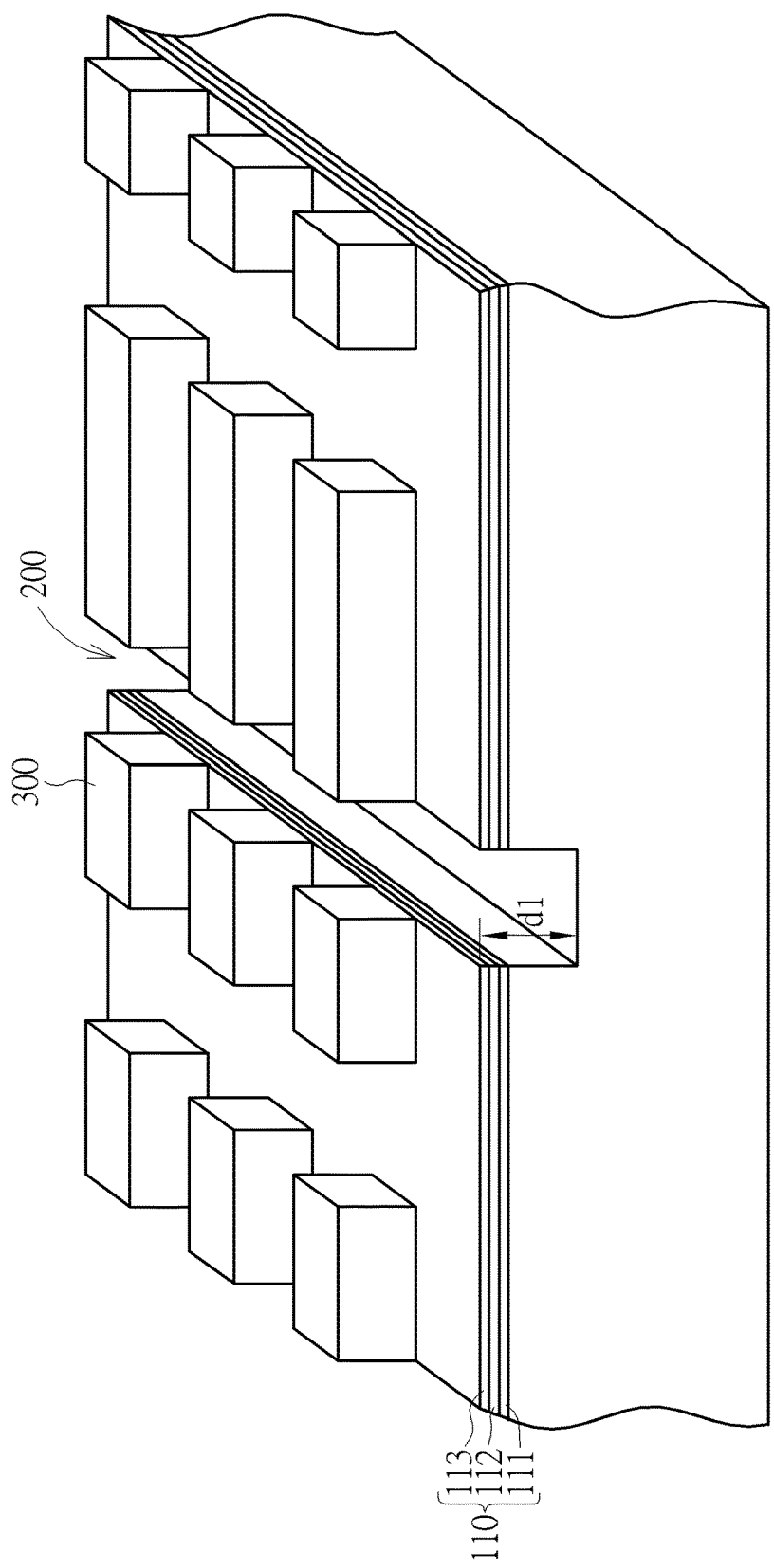
Figure 3:
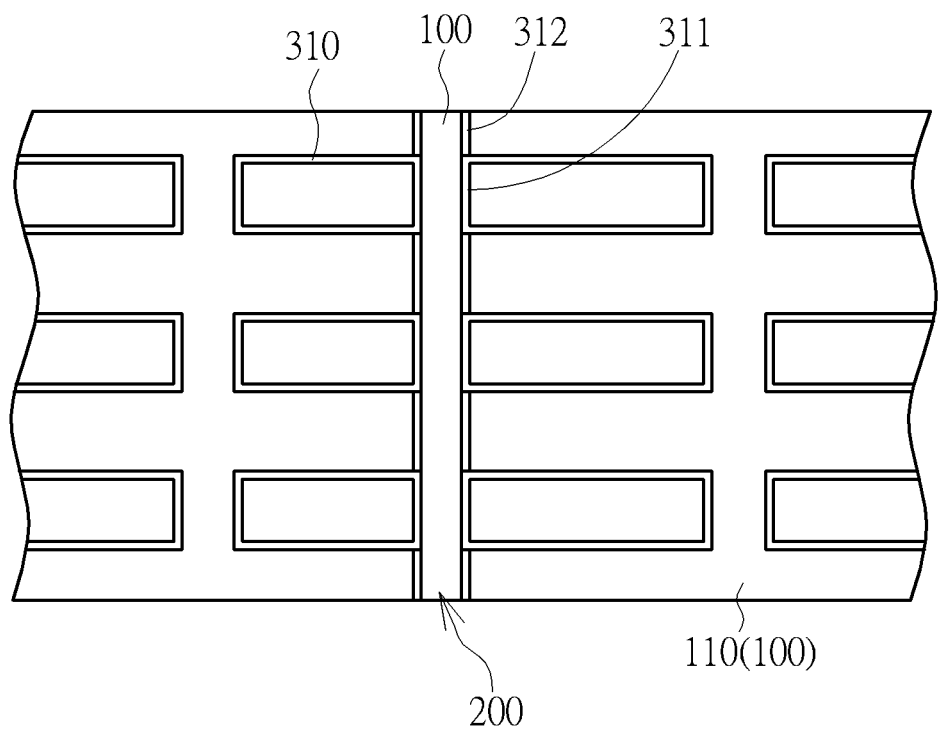
Figure 6:
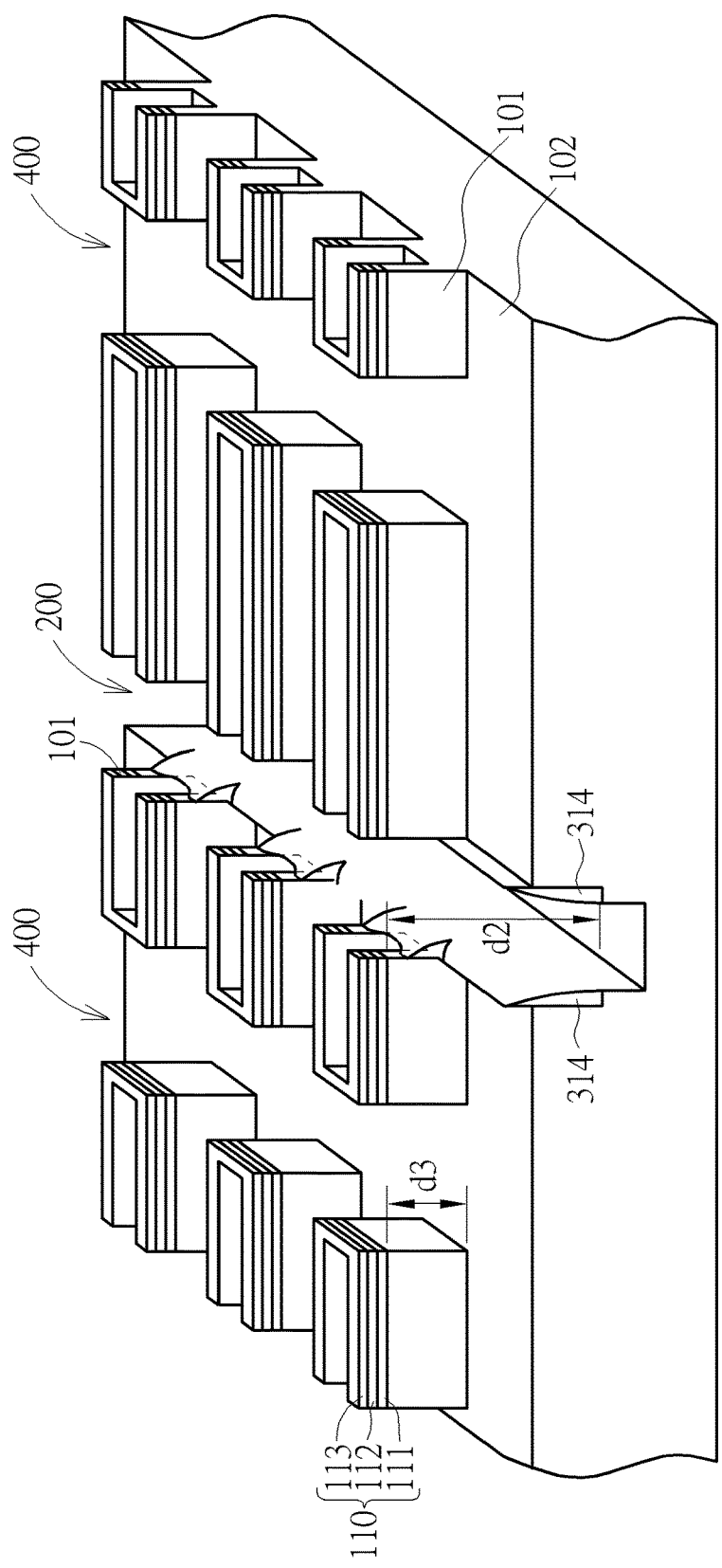
Figure 7:
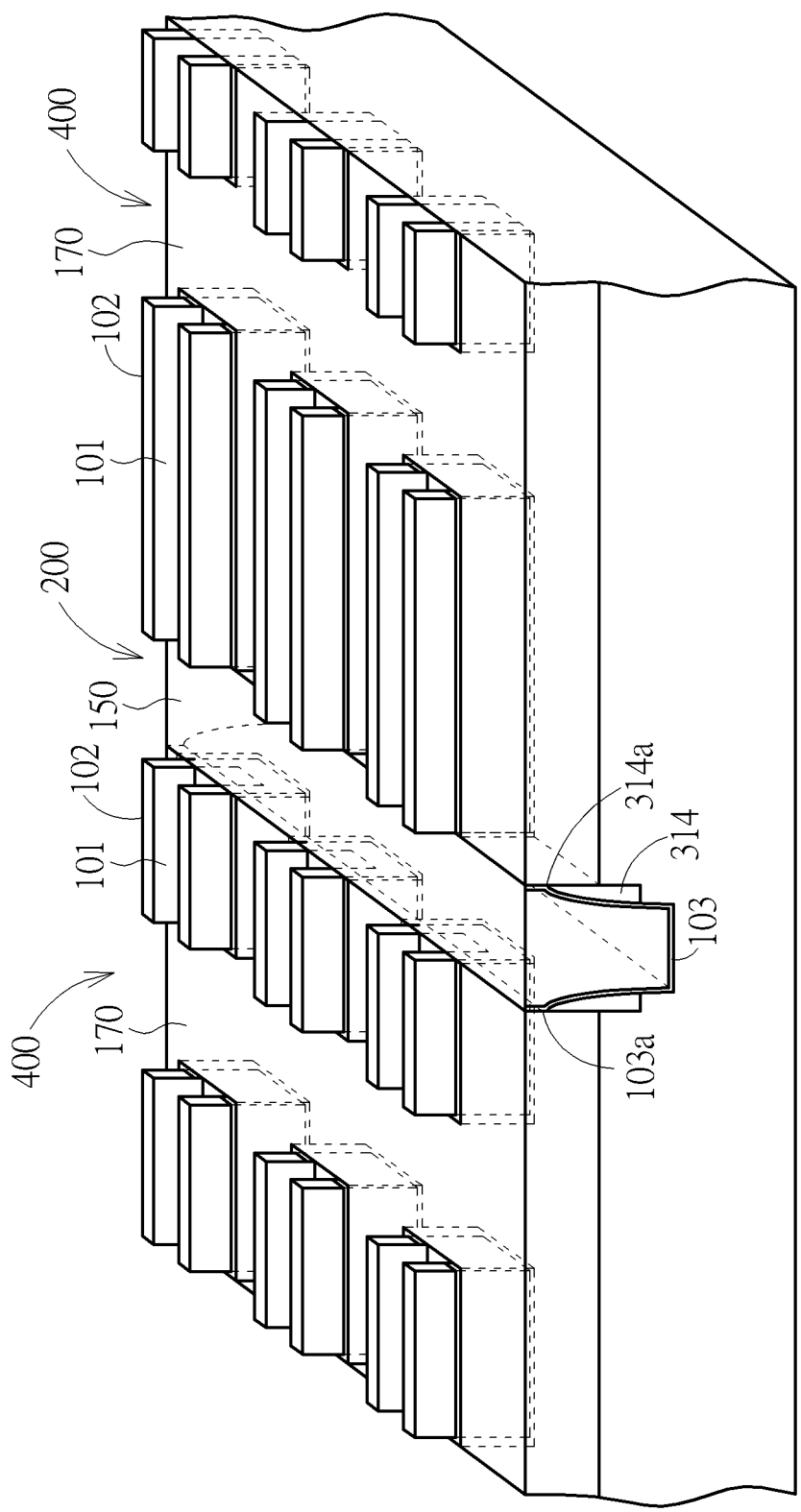
Figure 8:
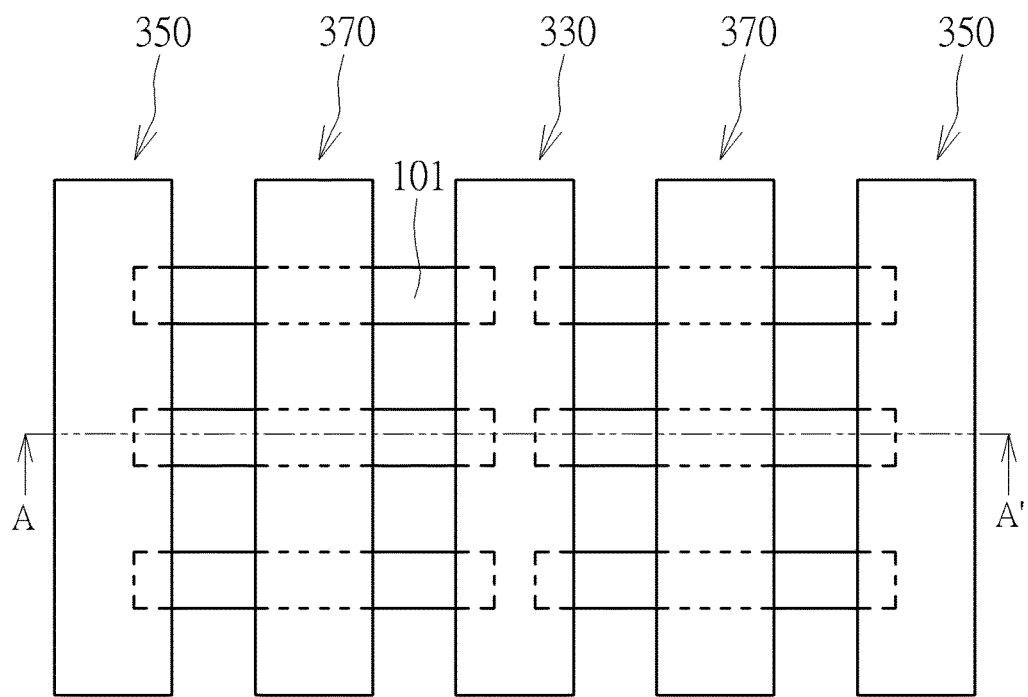
Figure 9:
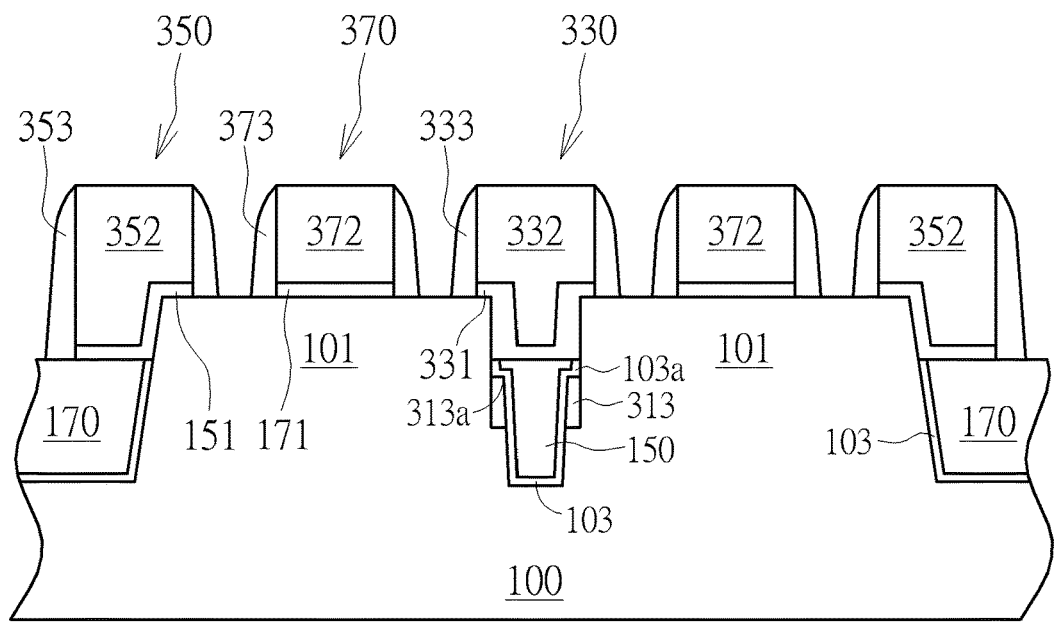

Please refer to FIG. 1 to FIG. 9, which are schematic diagrams illustrating a method of forming a semiconductor device according to the first embodiment of the present invention, wherein FIG. 1, FIG. 3 and FIG. 8 show top views of the semiconductor device informing steps, and FIG. 9 shows a cross-sectional view taken along the cross line A-A' in FIG. 8. First of all, as shown in FIG. 1, a substrate 100 is provided. The substrate 100 for example includes a semiconductor substrate, such as a silicon substrate, a silicon-containing substrate or a silicon-on-insulator (SOI) substrate, and a plurality of mandrels 300 is formed on a surface of the substrate 100.

In the present embodiment, the formation of the mandrels may be integrated into a conventional semiconductor process, for example, a general gate process may be performed to form a plurality of gate patterns which are configured to the mandrels 300 on the substrate 100. In this way, the mandrels 300 may include polysilicon or other suitable materials having etching selectivity relative to the substrate 100 or a mask layer underneath, such as silicon oxide or silicon nitride. However, people skilled in the art shall easily realize that the forming method, as well as the materials, of the mandrels 300 are not limited thereto, and may include other processes or materials which are well known in the art and will not be further detailed herein. Precisely, the mandrels 300 are spaced from each other, such that, a pitch P being at least greater than a width W of the mandrels 300, may be performed between any two adjacent mandrels 300, but is not limited thereto.

Also, in one embodiment, a hard mask layer 110 including a single layer structure or a multi-layer structure may be formed before the mandrels 300 are formed, as shown in FIG. 1. The hard mask layer 110 for example includes a silicon oxide layer 111, a silicon nitride layer 112 and a silicon oxide layer 113, but is not limited thereto. In another embodiment, the hard mask layer 110 may also be omitted, thereby directly forming mandrels (not showing in the drawings) on the substrate 100.

Next, an etching process is performed, to remove a portion of the mandrels 300, and a portion of the hard mask layer 110 and a portion of the substrate 100 underneath, so that, a trench 200 penetrates through the mandrels 300 may be formed, as shown in FIG. 2. In one embodiment, the trench 200 may have a depth d1 being about 1000 micrometers to 1500 micrometers, but is not limited thereto.

Figure 4:
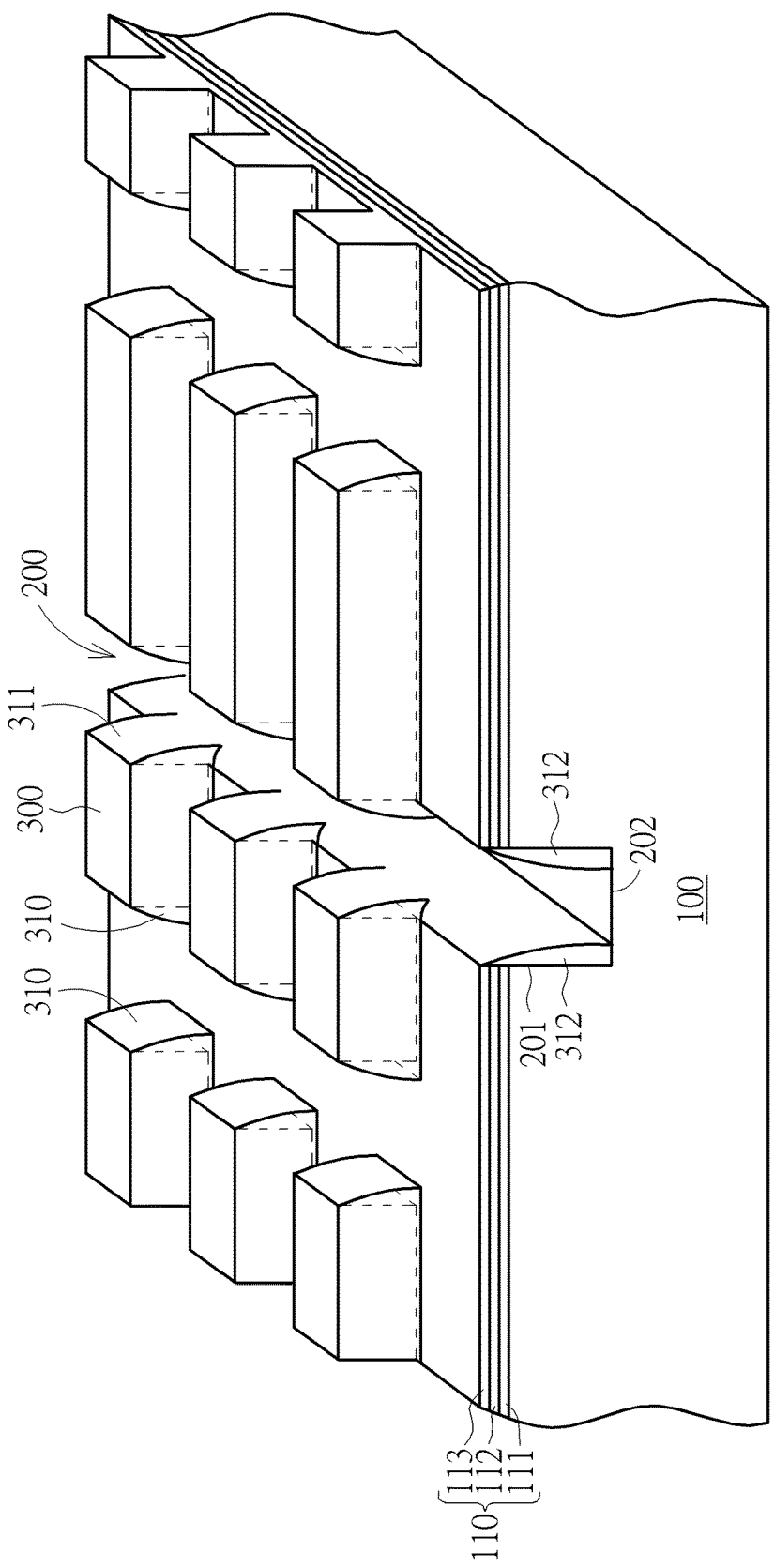

Then, a spacer 310 surrounding each of the mandrels 300 may be formed. Specifically, the formation of the spacer 310 may include firstly forming a spacer material layer (not shown in the drawings) on the substrate 100 to cover the mandrels 300, and performing an etching back process to completely remove the spacer material layer on top surfaces of the hard mask layer 110 and the mandrels 300, so as to form the spacer 310 surrounding the mandrels and adjacent thereto, as shown in FIG. 3 and FIG. 4. In one embodiment, the spacer 310 may include a single layer structure or a multi-layer structure, and may include a material having etching selectivity relative to the mandrels 300 and the hard mask layer 110, like silicon nitride or silicon oxynitride, for example, but is not limited thereto. In another embodiment of omitting the hard mask layer 110, the spacer 310 may also include a material having etching selectivity relative to the mandrels 300 and the substrate 100.

It is worth mentioning that, while the spacer material layer is formed, the spacer material layer may also fill into the trench 200, and at least cover sidewalls 201 and a bottom surface 202 of the trench 200. Then, the spacer material layer disposed on the bottom surface 202 may be partially removed as the etching back process, so that, only the spacer material layer disposed on the sidewall 201 of the trench 200 may remain, to form a spacer 311 extending from sidewalls of each mandrel 300 to the bottom surface of the trench 200 and a spacer 312 disposed on the sidewalls 201 of the trench 200, as shown in FIG. 4. In other words, since the trench 200 is formed previously than the formation of the spacer 310 in the present embodiment, a portion of the spacer 310, namely spacer 311, 312, may deeply extend into the trench 200 till covering on the sidewalls 201 of the trench 200.

Figure 5:
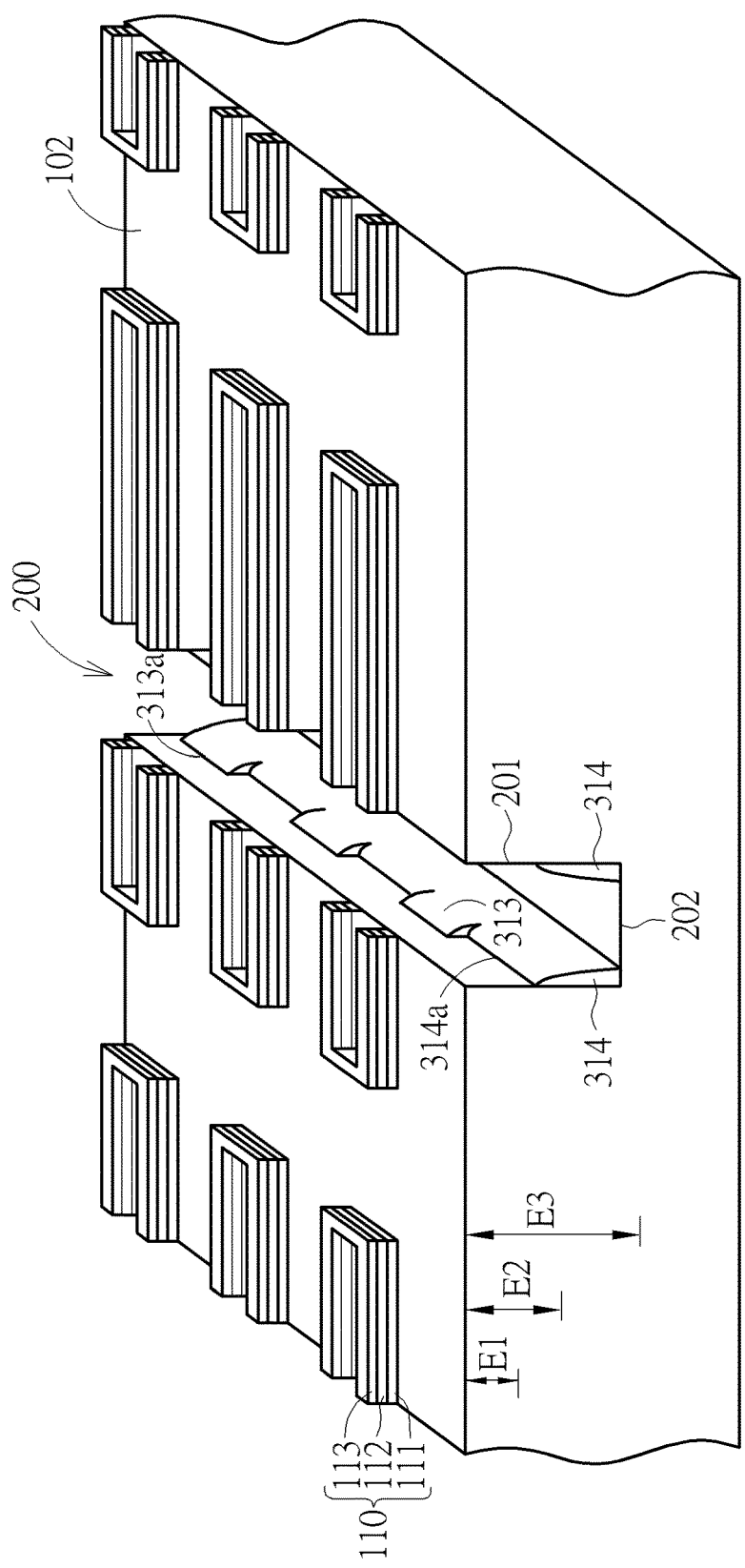

Following these, the mandrels 300 may be completely removed, and a transferring process may be performed by using each spacer 310, 311, 312 as a mask, to form at least one fin shaped structure 101 in the substrate 100. Precisely speaking, after removing the mandrels 300, a dry etching process, a wet etching or a sequentially performed dry and wet etching process may be performed to transfer patterns of the spacer 310 to the hard mask layer 110 underneath, for patterning the hard mask layer 110, and the spacer 310 may be then removed. It is noted that, the spacers 311, 312 are filled in the trench 200 and have a relative greater height than that of the spacer 310 only formed on the hard mask layer 100. Thus, while using the dry etching process or other anisotropic etching processes to remove the spacers 310, 311, 312, only the spacer 310 disposed on the hard mask layer 110 may be completely removed, and the spacers 311, 312 may only be partially removed. Precisely, only the portion of the spacers 311, 312 disposed above a horizontal extending surface of the hard mask layer 110 is removed, and the rest portion of the spacers 311, 312 disposed below the horizontal extending surface is partially removed, thereby forming spacing layers 313, 314 on the sidewalls 201 of the trench 200, as shown in FIG. 5. In other words, the spacers 311, 312 of the present embodiment have a relative greater thickness than that of the spacer 310, so that, the spacers 311, 312 may not be completely removed while removing the spacer 310. In this manner, the non-removed portion of the spacers 311, 312 may remain to form the spacing layers 313, 314, which have top surfaces 313a, 314a being lower than the top surface 102 of the substrate 100, as shown in FIG. 5.

After that, the patterned hard mask layer 110 may be used as a mask to etch the substrate 100, to form at least one shallow trench 400 in the substrate 100 and to format least one fin shaped structure 101 in a non-etched portion of the substrate 100, as shown in FIG. 6. Please note that, while etching the substrate 100, a different amount of the substrate 100 may be removed optionally, to form the shallow trench 400 in different depth. For example, arrows shown in FIG. 5 refer the expected etched-portion in the substrate 100. If an E1 portion of the substrate 100 is removed, a shallow trench (not shown in the drawings) having a bottom being higher than the top surface 314a may be formed; if an E2 portion of the substrate 100 is removed, a shallow trench having a bottom being lower than the top surface 314a may be formed, as the shallow trench 400 shown in FIG. 6; and if an E3 portion of the substrate 100 is removed, a shallow trench (not shown in the drawings) having a bottom being lower than the top bottom surface 202 of the trench 200 may be formed. It is also worth noting that, while the substrate 100 is etched, an exposed portion of the substrate 100 in the trench 200 may also be etched, so that, the depth of the trench 200 may increase from d1 to d2, as shown in FIG. 6. In the present embodiment, the trench 200 is etched repeatedly, so that, the shallow trench 400 may have a relative small depth d3, in comparison with the trench 200, but is not limited thereto.

However, the forming method of the fin shaped structure 101 and the shallow trench 400 is not limited to the aforementioned processes, and may include other forming process. For example, in another embodiment, a shallow trench (not shown in the drawings) having a same depth as the trench 200 may be optionally formed by first providing a mask (not shown in the drawings) only covering the trench 200 and performing the etching process to form the shallow trench. Otherwise, in another embodiment of omitting the hard mask layer 110, the patterns of the spacers 310 may also be transferred directly to the substrate 100, to form fin shaped structures having the same layout as the spacer 310, and the spacer 310 on the hard mask layer 110 is then removed. Also, people in the art shall easily realize that the removing of the spacers 311, 312 in the present embodiment may be similar to those mentioned above, to form the spacing layers 313, 314, and will not further detailed herein. In addition, in one embodiment, a fin cur process may be performed to remove a portion of the fin shaped structure 101, thereby forming fin shaped structures having a required layout in the subsequent process, for example, forming a plurality of fin shaped structures being isolated and paralleled to each other, as shown in FIG. 7, but not limited thereto.

Next, a dielectric layer may be formed on the substrate 100 and the fin shaped structure 101, to function like a liner 103, and an insulating layers 150, 170 filled in the trench 200 and the shallow trench 400 are formed subsequently. The liner 103 may include a single layer structure or multilayer structure, and preferably includes silicon oxide or suitable high dielectric constant materials; the insulating layer 150 170 may include silicon oxide or other suitable insulating materials. The method of forming the liner 103 and the insulating layers 150, 170 may include using an atomic layer deposition (ALD) process, to form a liner material layer (not shown in the drawings) evenly covering the fin shaped structure 101, the shallow trench 400 and the trench 200, and using a flowable chemical vapor deposition (FCVD) process to from an insulating material layer (not shown in the drawings) on the liner material layer, and performing a chemical mechanical polishing (CMP) process and at etching back process, to remove a portion of the insulating material layer and a portion of the liner material layer, thereby forming the liner 103 and the insulating layers 150, 170 in the trench 200 and the shallow trench 400 respectively, as shown in FIG. 7. However, the formation of the liner 103 and the insulating layers 150, 170 are not limited to the aforementioned processes, and may include other forming method. For example, in another embodiment, an in situ steam generation (ISSG) process or a thermal oxidation process may be performed to form a uniform liner (not shown in the drawings) only on exposed surfaces of the substrate 100.

Through the above-mentioned process, a portion of the fin shaped structure 101 may protrude from the insulating layer 170, such that, the insulating layer 170 formed in the shallow trench 400 may configure as a shallow trench isolation (STI). It is noted that, in the present embodiment, the patterned hard mask layer 110 may be removed optionally while the chemical mechanical polishing process and the etching back process are performed, due to the structural characteristics of tri-gate transistor device formed subsequently, as shown in FIG. 7. However, the present invention is not limited thereto, and the patterned hard mark layer 110 may also be remained or partially removed in another embodiment, for complying with the structural characteristics of dual-gate transistor device formed subsequently. Furthermore, it is worth mentioning that, a portion of the liner material layer may be formed on the spacing layers 313, 314, in the trench 200, to directly contact a top portion and the bottom surface 202 of the sidewalls of the trench 200 and/or a top portion of sidewalls the fin shaped structure 101. Thus, a shoulder portion 103a of the liner 103 may be formed at the top surface 313a of the spacing layer 313 and/or the top surface 314a of the spacing layer 314, as shown in FIG. 7.

Next, dummy gate structures 330, 350 and a gate structure 170 across the fin shaped structure 101 may be formed, as shown in FIG. 8 and FIG. 9. In the present embodiment, the formation of the dummy gate structures 330, 350 may be integrated with a general gate forming process. For example, a gate forming process may be performed, including sequentially forming a gate dielectric material layer (not shown in the drawings), such as including an insulating material (e.g. silicon oxide), and a gate layer (not shown in the drawings) on the fin shaped structures 101, and patterning the gate layer and the gate dielectric material layer, to form the gate structures 370, having a gate dielectric layer 371 and a gate electrode 372, and the dummy gate structures 330, 350, having dielectric layers 331, 351 and gate electrodes 332, 352 respectively. Thus, in one embodiment, the gate electrodes 332, 352 of the dummy gate structures 330, 350 may include polysilicon, but the material thereof is not limited thereto and may be further modified according to the practical requirements. Subsequently, spacers 333, 353, 373 which surround the dummy gate structures 330, 350 and the gate structure 370 are formed, wherein the spacers 333, 353, 373 may include silicon nitride, silicon oxynitride or silicon carbonitride.

It is worth of noting that, the dummy gate structure 330 crosses above the trench 200 and covers on the fin shaped structure 101 adjacent to the trench 200, so that, a portion of the dummy gate structure 330 may be formed in the trench 200, and disposed on the insulating layer 150 formed in the trench 200, as shown in FIG. 9. With such arrangement, the dummy gate structure 330 and the spacer 333 are able to cover both two edges of the fin shaped structure 101, to avoid the fin shaped structure 101 being affected by the following forming processes, like a source/drain epitaxial growing process for example, and to keep from structural deformation, current leakage or defects of entire electrical performance.

Summarizing these, the semiconductor device according to the first embodiment of the present invention may be obtained through the above-mentioned processes. Precisely speaking, the semiconductor device may include the fin shaped structure 101, the shallow trench 400 surrounding the fin shaped structure 101, the trench 200 formed between the fin shaped structure 101 for penetrating thereto, the spacing layers 313, 314 only contacting and formed on the sidewalls 201 of the trench 200, and the dummy gate structure 330 disposed on the fin shaped structure 101 and across the trench 200, wherein, the spacing layers 313, 314 have the top surfaces 313a, 314a being lower than the top surface 102 of the substrate 100, respectively. The trench 200 and the shallow trench 400 include the insulating layers 150, 170 formed therein respectively, wherein the insulating layer 170 formed in the shallow trench 400 may be configured as the shallow trench isolation. In one embodiment, the spacing layers 313, 314 only contact the sidewalls of the trench 200, and are formed between the insulating layer 150 and the fin shaped structure 101. In another embodiment, the semiconductor device also includes the liner 103, which is formed on the substrate 100 and the fin shaped structure 101, and a portion of the liner 103 is disposed in the trench 200, and between the insulating layer 150 and the spacing layers 313, 314, so as to form the shoulder portion 103a on the top surfaces 313a, 314a of the spacing layers 313, 314. On the other hands, another portion of the liner 103 may be formed on the sidewalls of the shallow trench 400, between the insulating layer 170 and the fin shaped structure 101.

In the subsequent process, a source/drain process, a selective epitaxial growing (SEG) process, a silicidation process, a contact etching stop layer (CESL) process or a replacement metal gate (RMG) process may be performed. Those processes are similar to a conventional forming process of a transistor and will not be further detail herein. The forming method of the present invention mainly forms a trench which penetrated through the mandrels and extends deeply into the substrate, and then processes the formation of spacers, so that, a portion of the spacer may cover the sidewalls of the trench, to form the spacing layer. Through such arrangement of forming the spacing layer, it is sufficient to avoid he silicon atoms contained in the sidewalls of the trench being over-consumed by or over-reacted with oxygen provided in the subsequent forming process of the shallow trench isolation or the dielectric layer, such as the flowable chemical vapor deposition process or the thermal oxidation process, and also to prevent the critical dimension of the trench opening from getting enlarged to a degree where it cannot be covered by the dummy gate structure. According to these, the present invention enables to form a single dummy gate structure which is across the trench and simultaneously covering on two edges of the fin shaped structure adjacent to the trench, so as to achieve better fin element performance and integration.

Also, people in the art shall easily realize that the semiconductor device of the present invention is not limited to be formed through the aforementioned processes, and may also be formed through other forming methods. The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
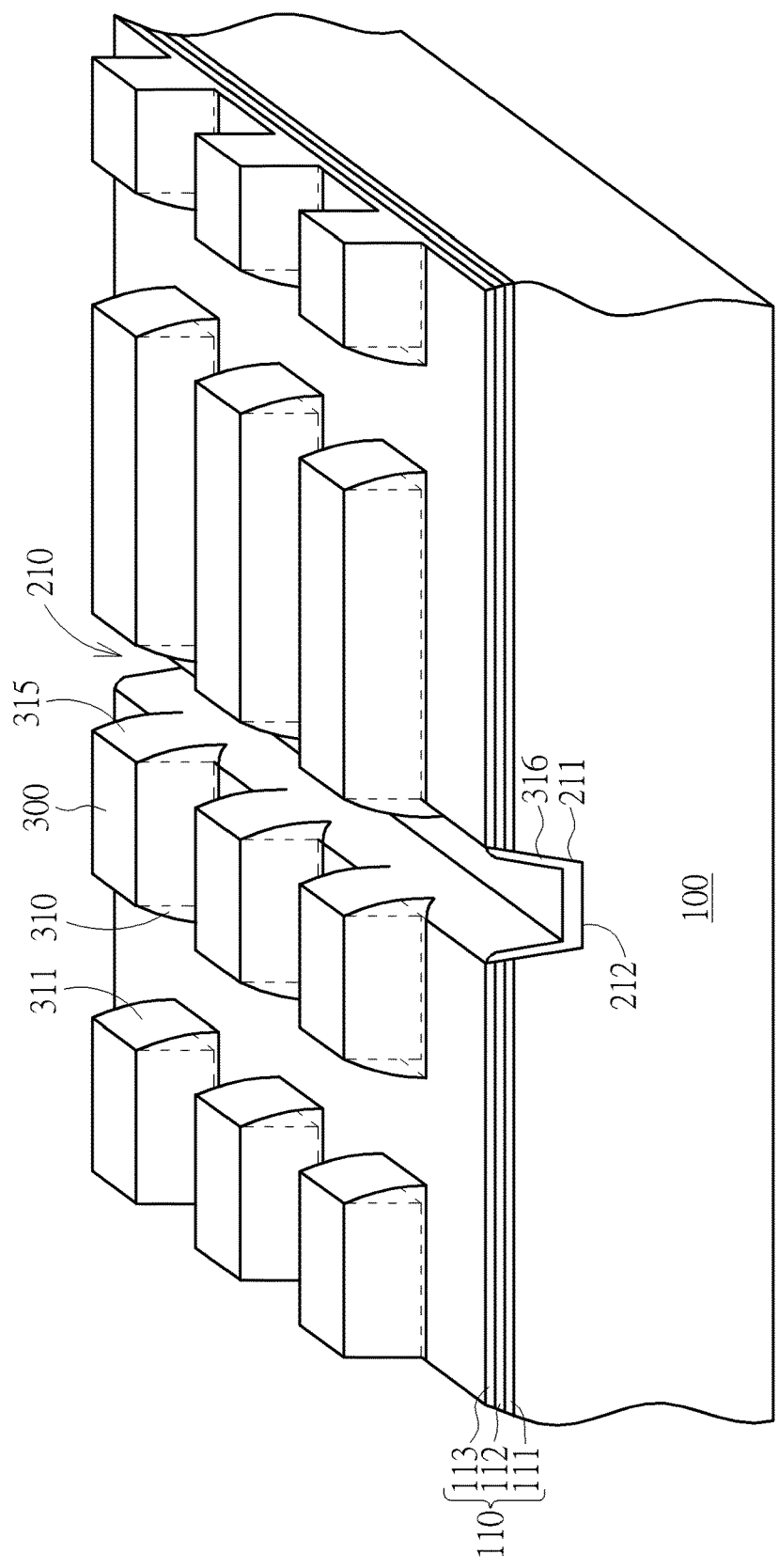
FIG. 10 to FIG. 13 are schematic diagrams illustrating a method of forming a semiconductor device according to a second embodiment of the present invention.

Referring to FIG. 10 to FIG. 13, which are schematic diagrams illustrating a method of forming a semiconductor device according to the second embodiment of the present invention. The formal steps in the present embodiment are similar to those in the first embodiment, and which includes forming the substrate 100 and the mandrels 300 on the substrate 100. However, the differences between the present embodiment and the aforementioned first embodiment are that, forming a trench 210 penetrating through the mandrels 300 and having tipped sidewalls 211, such that, the trench 210 may include a shape being relative greater at top and smaller at bottom, as shown in FIG. 10. In this way, while forming the spacer 310 surrounding the mandrels 300, the spacer material layer (not shown in the drawings) deposited in the trench 210 may form a thick film (not shown in the drawings) at a bottom surface 212 of the trench 210. Please note that, such thick film may not be completely removed in the subsequent etching back process, so that, spacers 315, 316 covering both the sidewalls 211 and the bottom surface 212 of the trench 210 may be formed accordingly, as shown in FIG. 10.

Figure 11:
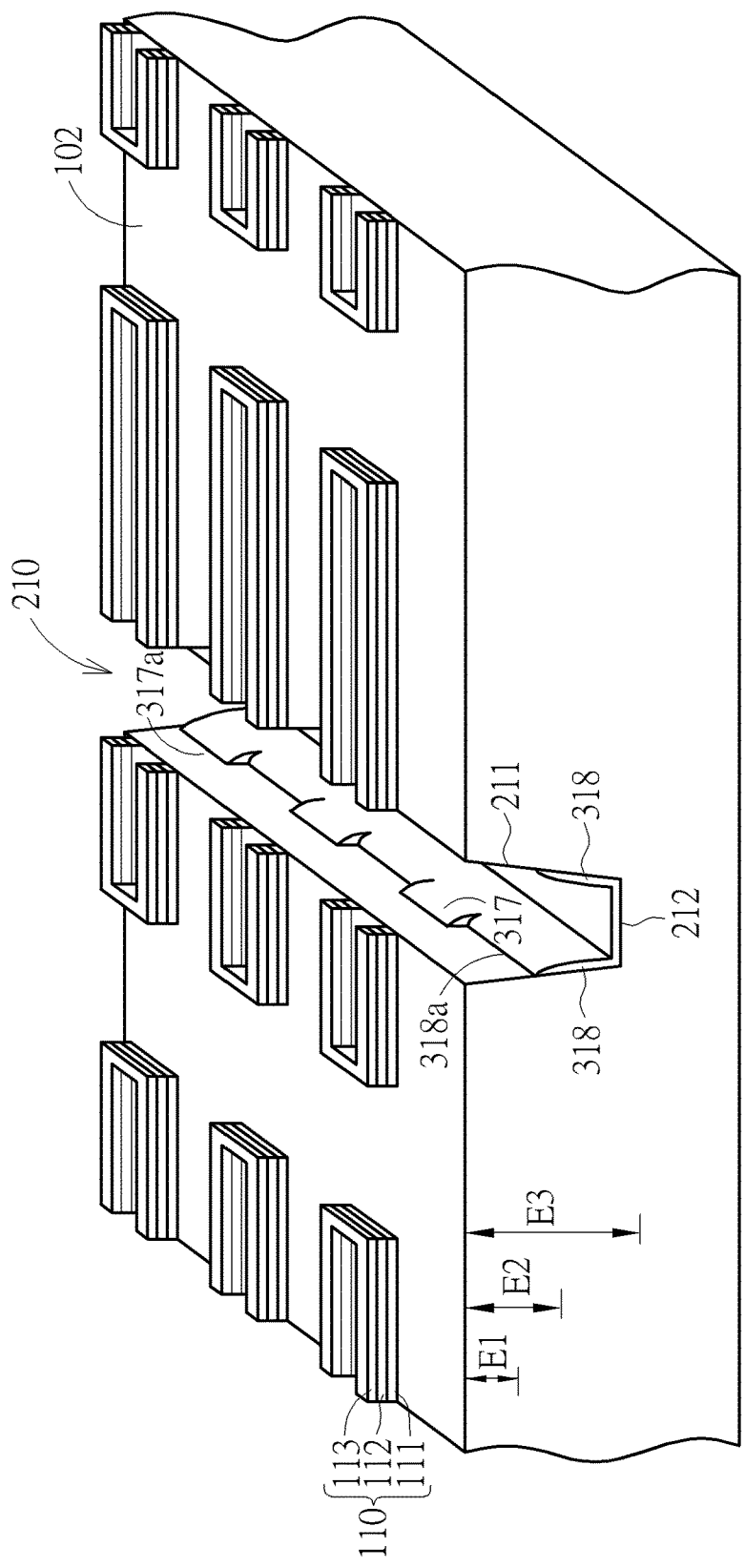
Figure 12:
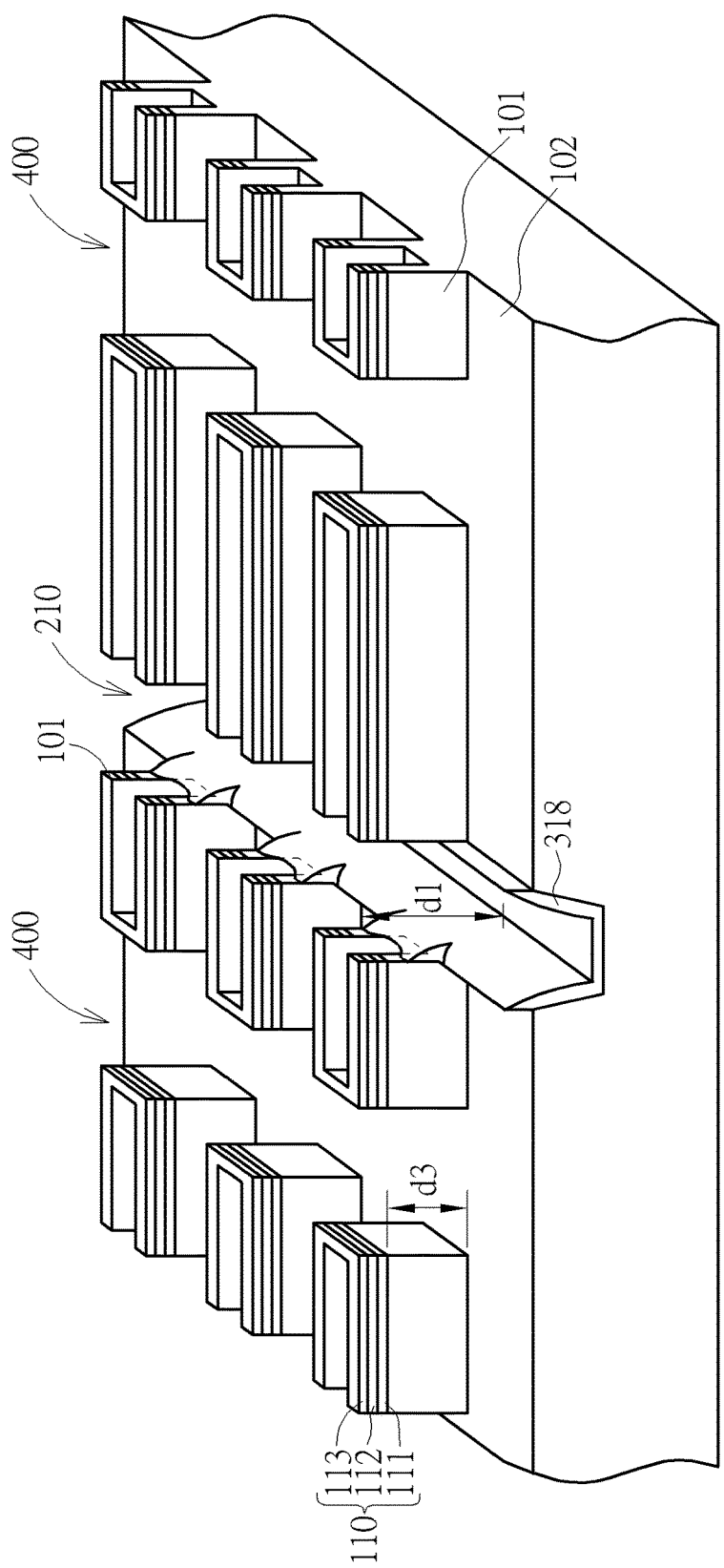

Next, similar to the aforementioned first embodiment, the mandrels 300 are removed, and the spacers 310, 315, 316 are used as a mask to perform a transferring process, for forming at least one fin shaped structure 101 in the substrate 100. Also, it is worth of mentioning that, after forming patterned hard mask layer 110 (namely, after transferring the patterns of the spacer 310 into the hard mask layer 110 underneath), the spacer 310 disposed above the hard mask layer 110 is removed. At this moment, the spacers 315, 316 covering on the sidewalls 211 and the bottom surface 212 of the trench 210 and having a relative greater thickness than that of the spacer 310 may not be completely removed, and the non-removed portion of the spacers 315, 316 may remain on the sidewalls 211 and the bottom surface 212 of the trench 210, to form the spacing layers 317, 318, as shown in FIG. 11. Then, the patterned hard mask layer 110 may be used as a mask to etch the substrate 100, to form at least one shallow trench 400 in the substrate 100 and to form at least one fin shaped structure 101 in non-etched portion of the substrate 100, as shown in FIG. 12.

Please also note that, similar to the aforementioned first embodiment, while etching the substrate 100, a different amount of the substrate 100 may be removed optionally, to form the shallow trench 400 having a relative lower or higher bottom in comparison with the trench 200. Also, since a portion of the spacing layers 317, 318 remain on the bottom surface 212 of the trench 210, the trench 210 may not be repeated etched while the substrate 100 is etched. Thus, a depth of the trench 210 of the present embodiment may be kept at the depth d1, as shown in FIG. 12.

Figure 13:
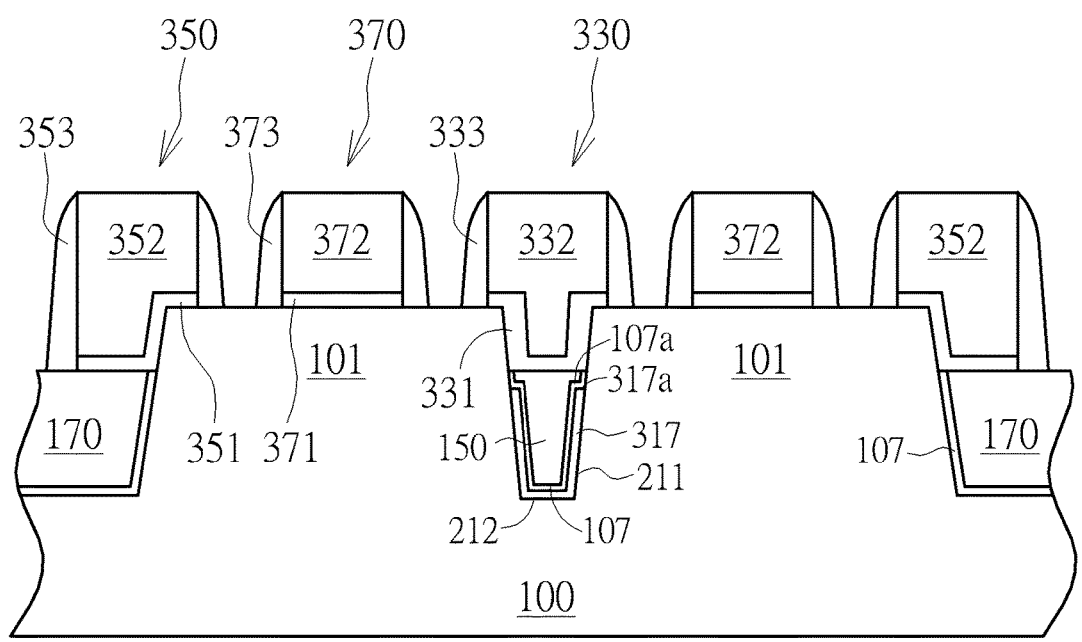

Except for the above-mentioned differences, other forming methods and detailed compositions of elements in the present embodiment are all similar to those in the aforementioned first embodiment, and will not be further detail herein. According these, the semiconductor device as shown in FIG. 13 may be obtained. It is noted that, the spacing layer 317 of the present embodiment covers both the sidewalls 211 and the bottom surface 212 of the trench 210, so that a liner 107 formed subsequently may directly covers on the spacing layer 317, and only contacts a top portion of the sidewalls 211 without directly contacting the bottom surface 212 of the trench 210, as shown in FIG. 13. Also, the liner 107 also includes a shoulder portion 107a.

Through the above-mentioned processes, the semiconductor device according to the second embodiment of the present invention may be obtained. The semiconductor device may include the fin shaped structure 101, the shallow trench 400 surrounding the fin shaped structure 101, the trench 210 formed between the fin shaped structure for penetrating thereto, the spacing layers 317, 318 disposed on the sidewalls 201 of the trench 200, and the dummy gate structure 330 disposed on the fin shaped structure 101 and across the trench 210, wherein the spacing layers 317, 318 also have top surfaces 317a, 318a being lower than the top surface 102 of the substrate 100, respectively. Also, the trench 210 includes the tipped sidewalls 211, such that, a portion of the spacing layers 317, 318 may form on the bottom surface 212 of the trench 210.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a plurality of mandrels on a substrate, each of the mandrels spaced from each other on a planar surface of the substrate;
   removing a portion of the mandrels and a portion of the substrate to form a trench across the mandrels, the trench having a bottom surface lower than the planar surface;
   forming a plurality of spacers not sealing the whole trench formed on the planar surface of the substrate, the spacers only covering sidewalls of the mandrels and the trench;
   after completely removing the mandrels, using the spacers as a mask to form a plurality of fin shaped structures on the substrate and a plurality of shallow trenches surrounding the fin shaped structures; and
   removing a portion of the spacers to form a spacing layer on the sidewalls of the trench, wherein the spacing layer has a top surface being lower than a top surface of the fin shaped structures.

2. The method of forming a semiconductor device of claim 1, further comprising:

forming an insulating layer in the trench, wherein the insulating layer covers on the spacing layer.

3. The method of forming a semiconductor device of claim 1, further comprising:
forming a liner on the sidewalls of the trench and sidewalls of the shallow trench.

4. The method of forming a semiconductor device of claim 3, wherein the liner is formed between the insulating layer and the substrate in the trench.

5. The method of forming a semiconductor device of claim 3, wherein the liner comprises a shoulder portion in the trench.

6. The method of forming a semiconductor device of claim 1, wherein the sidewalls of the trench are tipped, and the spacing layer is also formed on a bottom surface of the trench.

7. The method of forming a semiconductor device of claim 1, further comprising:
forming a dummy gate structure across the trench, wherein a portion of the dummy gate structure is formed in the trench.

8. A method of forming a semiconductor device, comprising:
providing a plurality of mandrels on a substrate;
removing a portion of the mandrels and a portion of the substrate to form a trench across the mandrels;
forming a plurality of spacers not sealing the whole trench formed on sidewalls of the mandrels to surround each of the mandrels respectively, and on sidewalls of the trench;
using the spacers as a mask to form a plurality of fin shaped structures on the substrate and a plurality of shallow trenches surrounding the fin shaped structures; and
completely removing the spacers surrounded each of the mandrels respectively to leave the spacers formed on the sidewalls of the trench to form a spacing layer, wherein the spacing layer has a top surface being lower than a top surface of the fin shaped structures.

9. The method of forming a semiconductor device of claim 8, further comprising:
forming an insulating layer in the trench, wherein the insulating layer covers on the spacing layer.

10. The method of forming a semiconductor device of claim 8, further comprising:
forming a liner on the sidewalls of the trench and sidewalls of the shallow trench.

11. The method of forming a semiconductor device of claim 10, wherein the liner is formed between the insulating layer and the substrate in the trench.

12. The method of forming a semiconductor device of claim 10, wherein the liner comprises a shoulder portion in the trench.

13. The method of forming a semiconductor device of claim 8, wherein the sidewalls of the trench are tipped, and the spacing layer is also formed on a bottom surface of the trench.

14. The method of forming a semiconductor device of claim 8, further comprising:
forming a dummy gate structure across the trench, wherein a portion of the dummy gate structure is formed in the trench.

* * * * *